United States Patent [19]

Harr

[11] Patent Number: 4,513,254
[45] Date of Patent: Apr. 23, 1985

[54] INTEGRATED CIRCUIT FILTER WITH ADJUSTABLE CHARACTERISTICS

[75] Inventor: Jerome D. Harr, San Jose, Calif.

[73] Assignee: International Business Machines Corporation, Armonk, N.Y.

[21] Appl. No.: 495,311

[22] Filed: May 16, 1983

[51] Int. Cl.³ .............................................. H03F 1/34
[52] U.S. Cl. ................................. 330/294; 330/109; 330/307
[58] Field of Search ............... 330/107, 109, 294, 307

[56] References Cited

U.S. PATENT DOCUMENTS

| | | | |
|---|---|---|---|
| 3,805,178 | 4/1974 | Rollett | 330/109 |
| 3,867,712 | 2/1975 | Harthill | 333/17 |
| 3,889,108 | 6/1975 | Cantrell | 333/17 |
| 4,201,960 | 5/1980 | Skutta | 333/17 |
| 4,244,008 | 1/1981 | Holt | 360/45 |

OTHER PUBLICATIONS

"Monolithic Filters", *Digest of Technical Papers,* 1980, IEEE International Solid State Circuit Conference.

*Primary Examiner*—James B. Mullins
*Assistant Examiner*—G. Wan
*Attorney, Agent, or Firm*—R. E. Cummins; T. R. Berthold

[57] ABSTRACT

An adjustable filter arrangement is disclosed which is implemented in integrated circuit technologies. The filter configuration corresponds to a SALLEN-KEY filter in which the amplifier function is obtained by a transistor device, the R1 and R2 resistor functions are obtained by a first pair of suitably connected diodes, and the C1 and C2 functions are also integrated into the semiconductor chip. Adjustment of the natural frequency of the filter is obtained by the value of an externally supplied control current through the pair of diodes corresponding to R1 and R2. Adjustment of the damping characteristic of the filter is obtained by supplying a second control current to cause a relative change between the values of R1 and R2. No external components need be attached to the integrated circuit filter.

10 Claims, 9 Drawing Figures

INTEGRATED CIRCUIT FILTER WITH ADJUSTABLE CHARACTERISTICS

BACKGROUND OF THE INVENTION

1. Field of Invention

This invention relates in general to electrical signal filters and, in particular, to an integrated circuit filter arrangement whose filter characteristics are adjustable.

2. Cross-Referenced Applications

Ser. No. 494,822, filed concurrently herewith in the name of Harr and Hense, entitled "Recording Channel with Signal Controlled Integrated Analog Circuit" and common assigned, discloses and claims a disk file recording channel in which the present invention is advantageously employed.

3. Description of the Prior Art

The cross-referenced application discloses a recording channel for a disk file which requires a filter that is adjustable. The read portion of the recording channel on disk files employs a filter arrangement for eliminating unwanted noise and for shaping the frequency and pulse characteristics of the signal from the magnetic read head. The cut-off frequency of such a filter is designed to be slightly higher than the highest frequency in the readback signal so that as much unwanted noise as possible is rejected. Also, particular frequencies in the readback signal are sometimes emphasized by the filters to enhance the performance of the signal processing circuits downstream, such as the detector.

Historically, these filters are made of discrete passive components, i.e., inductors and capacitors. The filter characteristics are, therefore, fixed at design time by the parameters of these passive components. This prevents a single filter from obtaining optimum performance if, for example, the disk file has a banded recording type of technique for storing data. In banded recording, the outer tracks on the disk surface have a much higher number of bits per track than inner tracks, which results in a higher readback frequency on the outer tracks. If a single filter is to be used in such an environment, then the filter cut-off frequency must be set high enough to properly pass the signals at the outer band. However, on the inner band where the readback signal is much lower, the filter cut-off frequency is now set too high to eliminate unwanted noise above the lower frequency. Thus, excessive noise exists when reading the inner band of tracks. Also, the frequencies that were emphasized in the outer band now have been shifted at the inner band and are not emphasized properly.

The prior art has suggested various arrangements for adjusting filters, none of which have proved applicable for use in a filter for a recording channel of a disk file. See, for example, section 8 of the article entitled "Monolithic Filters" beginning on page 83 of the *Digest of Technical Papers* of the 1980 IEEE International Solid State Circuit Conference.

The sampling or switching techniques discussed on pages 88–97 of that referenced digest are not applicable because the filters have bandwidths that are too low to be useful in a recording channel. The gyrator apparatus described on pages 86–87 of that reference is operable at low frequencies, but designing an active gyrator circuit to operate in the range of typical present day recording channels, i.e., 10 through 50 MHz, becomes very difficult, if not impossible.

The prior art has also disclosed generally the implementation of filters employing integrated circuits, but, as disclosed in the cross-referenced application, these filters rely on the use of external components to obtain, the final adjustment of their characteristics. As discussed in that application, this becomes quite costly from a manufacturing standpoint and actually adversely affects the operation of the integrated circuit.

Further, while the art teaches generally adjusting the natural frequency and the damping characteristics of filters, in the disclosed prior art arrangement these adjustments are not mutually independent of each other in that an adjustment of the natural frequency, for example, affects the damping characteristics of the filter and vice versa. A filter arrangement in which the natural frequency may be adjusted independently of the damping characteristics and which is implemented in integrated circuit technologies without any external components would be advantageous for a recording channel of a disk file and several other filter applications. The present invention provides such a filter arrangement.

SUMMARY OF THE INVENTION

The present invention comprises a filter implemented in integrated circuitry in which the cut-off frequency and phase characteristics are controlled externally, for example, by a microprocessor and can be changed under the control of the microprocessor. The frequency of the filter is adjustable from about 10 to 50 MHz. All components of the filter are integrated on the chip, thereby eliminating the bulky precision inductors and capacitors which normally have accompanied adjustable filters in the prior art. Since the filter's characteristics are controllable, it can be advantageously employed in a recording channel of a disk file and can be changed as the read head is moved from track to track or from one band to another in the situation where the disk file has a banded recording architecture. Thus, each band can have a filter that is tailored to its particular frequency.

In addition, the microprocessor can adjust the filter tol obtain optimum performance from a particular head disk system attached to it.

In addition, if a magnetic head is changed in the field, the filter can automatically readjust itself to give optimum performance with the new head.

A further advantage of the present invention is the ability to change filter characteristics during error recovery operations where read operations are repeated to obtain valid information after a read error has been encountered. For example, the phase characteristics or damping factor of the filter can be dynamically changed in an attempt to compensate, for example, for peak shift in the readback signal which may be caused by off-track conditions or "dropouts" in the disk surface. The improved filter, therefore, can contribute to improving both the soft and hard error rates of the disk file.

It is, therefore, an object of the present invention to provide an improved adjustable integrated circuit filter.

Another object of the present invention is to provide an adjustable filter which is implemented in integrated circuit technology without any external components.

A further object of the present invention is to provide an improved filter in which an adjustment of the natural frequency of the filter does not affect the damping characteristics of the filter and vice versa.

The foregoing and other objects, features and advantages of the invention will be apparent from the following more particular description of a preferred embodi-

DESCRIPTION OF THE PREFERRED EMBODIMENT

Figure 1:
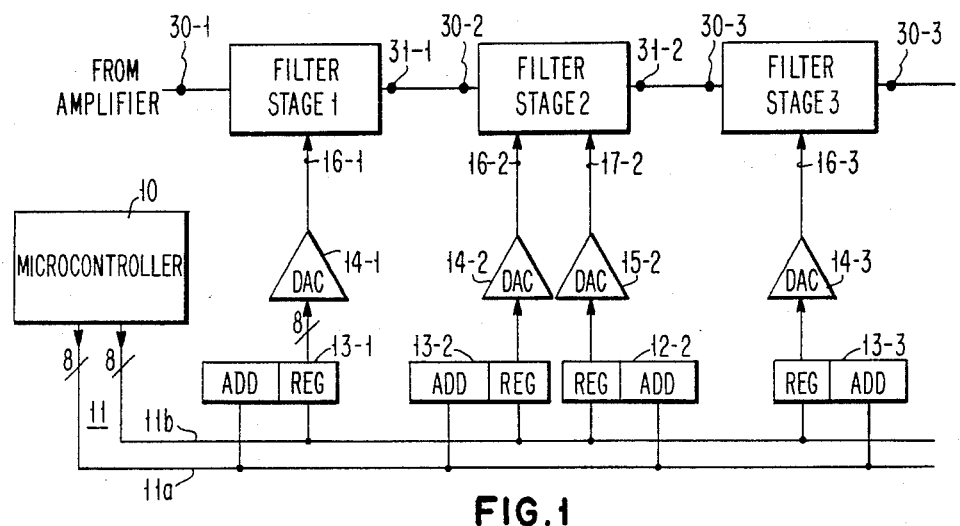
FIG. 1 is a block diagram of a three-stage filter embodying the present invention.

FIG. 1 illustrates a three-stage filter arrangement embodying the present invention. The arrangement shown in FIG. 1 corresponds generally to the filter arrangement shown in FIG. 1 of the cross-referenced application which is directed to the recording channel of a disk file. While the disclosed arrangement is advantageously employed in a recording channel of a disk file, it will be understood and appreciated by those individuals skilled in the art that the filter arrangement may be advantageously employed in many other environments.

As shown in FIG. 1, the filter arrangement further includes individual means 18 for controlling the characteristics of each filter stage which, as shown, comprises an addressable register 13 and a current output digital to analog converter 14. While three filter stages are shown in FIG. 1, it should be understood that the number of stages will depend primarily on the degree of attenuation desired of the signal being processed. As shown in FIG. 1, stages 1 and 3 each have one input control terminal 16 which will be described in detail later on in the specification. This input control terminal 16 permits the natural or cutoff frequency $\omega_f$ to be adjusted in accordance with the value of current supplied by the DAC 14-1 for stage 1 and DAC 14-3 for stage 3.

Stage 2 is provided with two control terminals 16-2 and 17-2 which permit either the natural frequency, the damping characteristics, or both to be adjusted by varying the currents supplied to terminal 16-2 from DAC 14-2 and the current supplied by DAC 15-2 to terminal 17-2.

The registers 12 and 13, as shown, are addressable by the microcontroller 10 via the address bus 11A and may be loaded by the microcontroller 10 via data bus 11B. In summary, adjustments to the filter stages are made by supplying a register with a new value which is converted to a change in current which changes the natural frequency or damping characteristic of the filter, as will now be explained in detail.

Figures 2A, 2B, 2C:
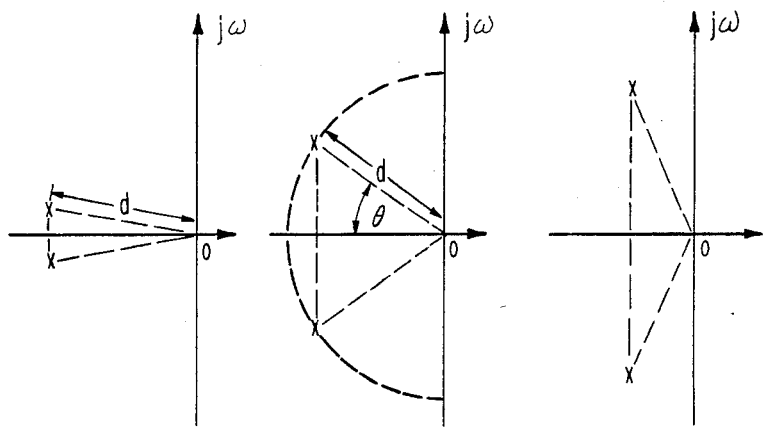
FIGS. 2a through 2d show pole positions of the three stages and the composite filter arrangement of FIG. 1.
Figure 2D:
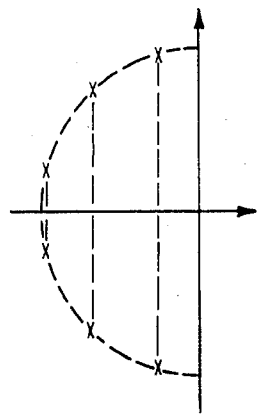

FIGS. 2a through 2c illustrate the position of the poles for each stage of the filter. When the filter stages are cascaded, as in FIG. 1, the overall pole position of the filter arrangement is obtained by superimposing the pole positions of each stage. FIG. 2d shows the pole positions of the overall transfer function of the filter system. The natural frequency of the filter stages is represented by the distance D from the pole to the origin, while the damping characteristic is of the cosine of the angle $\theta$ in FIGS. 2a through 2d. Various types of filters, therefore, may be obtained by merely changing the pole positions and damping characteristics of the filter stage.

Figure 3:
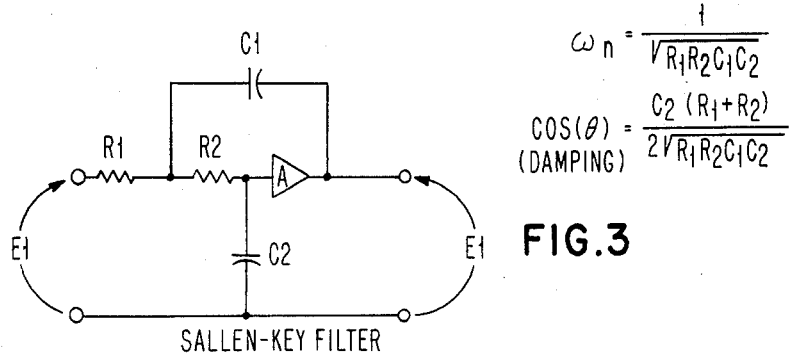
FIG. 3 illustrates diagrammatically the equivalent circuit configuration used for each of the filter stages of FIG. 1.

FIG. 3 shows the equivalent circuit configuration for each of the filter stages which corresponds to the well-known SALLEN-KEY filter arrangement. The equations for the cutoff frequency and damping for such an arrangement, where gain is equal to 1 for the amplifier A, are set forth immediately below FIG. 3.

Figure 4:
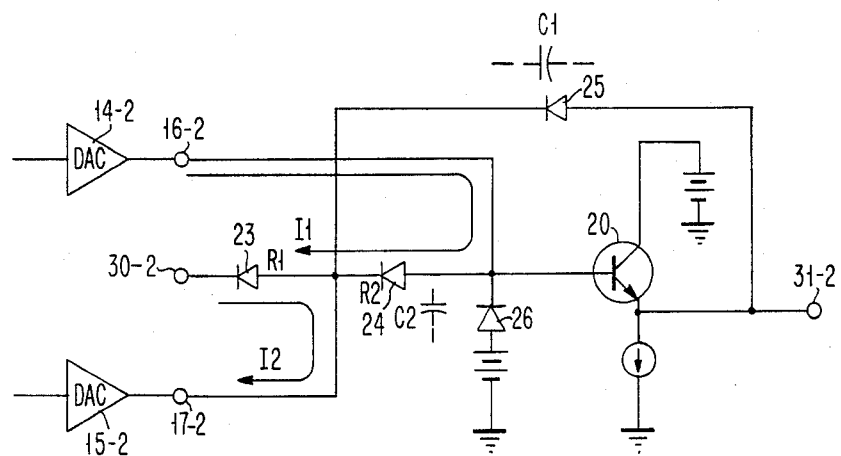
FIG. 4 shows the circuit of FIG. 3 implemented in integrated circuit form.

FIG. 4 illustrates the circuit of FIG. 3 as it is implemented with integrated circuit devices. As shown, the amplifier A of FIG. 3 is implemented by means of transistor device 20 connected as an emitter follower. While only one transistor device is illustrated, it should be understood that the amplifier could employ more than one transistor device. Resistor R1 is implemented by diode 23, while resistor R2 is implemented by diode 24. Capacitor C1 in FIG. 3 is implemented by diode 25 as shown in FIG. 4, while capacitor C2 in FIG. 3 is implemented by diode 26 as shown in FIG. 4.

Figure 5:
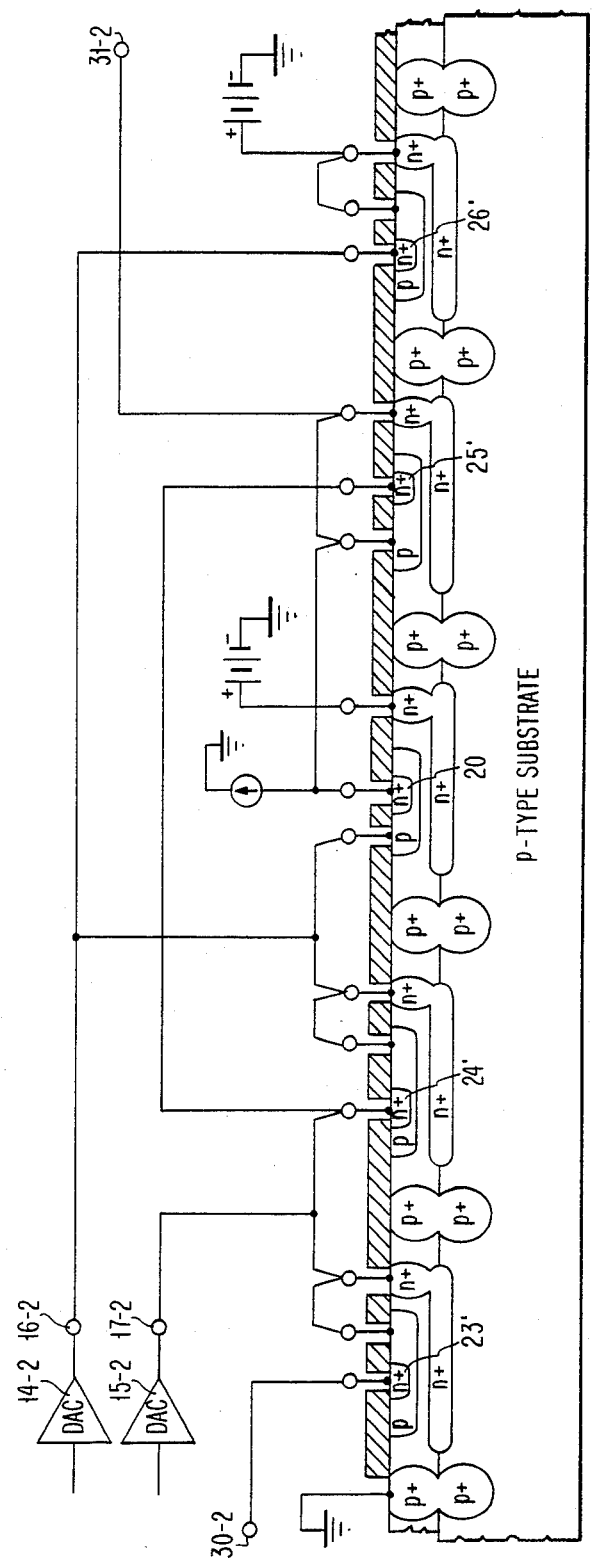
FIG. 5 is a sectional view of the integrated circuit chip illustrating how the diode components shown in FIG. 4 are implemented in the integrated circuit.

Capacitors C1 and C2 are formed by the depletion capacitance of reverse biased base emitter junctions 25' and 26' of NPN transistors, which can be seen diagrammatically in FIG. 5. The resistors R1 and R2 of FIG. 3 are formed from forward biased junctions 23' and 24' since the resistance of such a junction is inversely proportional to the current through the junction. The integrated components of the circuit of FIG. 4 are identified in FIG. 5 with like reference characters.

It can now be appreciated by referring to FIG. 4 that all that is necessary to adjust or control the filter characteristics $\omega_n$ and $\theta$ is to control the amount of current flowing through the diodes from digital to analog converters 16-2 and 17-2. Assume that current I2 is 0 and that we only want to control the natural frequency $\omega_n$ of the stage. In that case, DAC 14-2 produces all the diode current I1. The filter stage is designed by assuming equal values for R1 and R2, then picking values for C1 and C2 to get the appropriate damping. If I1 doubles, the values of R1 and R2 (the resistances of diodes 23 and 24) are cut in half, resulting in a doubling of the natural frequency $\omega_n$. However, the damping $\theta$ remains unchanged, as can be seen from the formulas immediately below FIG. 3. As both R1 and R2 double, both the numerator and denominator of the damping quotient double resulting in no change in the damping characteristics. The same logic holds true for changes in C1 and C2. For example, if they change together, only $\omega_n$ changes, not the damping characteristics $\theta$. This is very important and fortunate because it means that if the integrated components track each other well, then component changes due to the temperature, mask alignment, or wafer-to-wafer process variations in the manufacturing of such integrated circuits which might affect both R's or both C's equally will not affect the damping, but only the natural frequency of the filter stage. The result is that the pole positions won't shift relative to one another and, hence, the type of filter will not be inadvertently changed. The only change will be the filter's cut-off frequency. However, component changes due to temperature can be compensated for by tailoring the temperature coefficient of the digital to analog converter's output current, and the other "built-in" component changes are unimportant since the frequency is adjustable and is calibrated initially anyway.

From the above, it can be seen that in a filter, where the damping is fixed by design, the corner frequency can be changed by controlling the current I1 of the different stages through the digital to analog converters 14-1, 14-2 and 14-3.

In order to change the damping, the resistances R1 and R2 must be changed disproportionately. This is achieved by the digital to analog converter 15-2 associated with stage 2. The function of the digital to analog converter 15-2 is to change the division of current between the two resistors R1 and R2 represented by the diodes 23, 24. While the arrangement of the diodes as shown in FIG. 4 is the preferred arrangement, the circuit will work equally as well with the diodes connected cathode to cathode, or even with the diodes connected in the opposite direction than shown in FIG. 4. All that is necessary is to keep the current magnitudes in their proper relationships.

Figure 6:
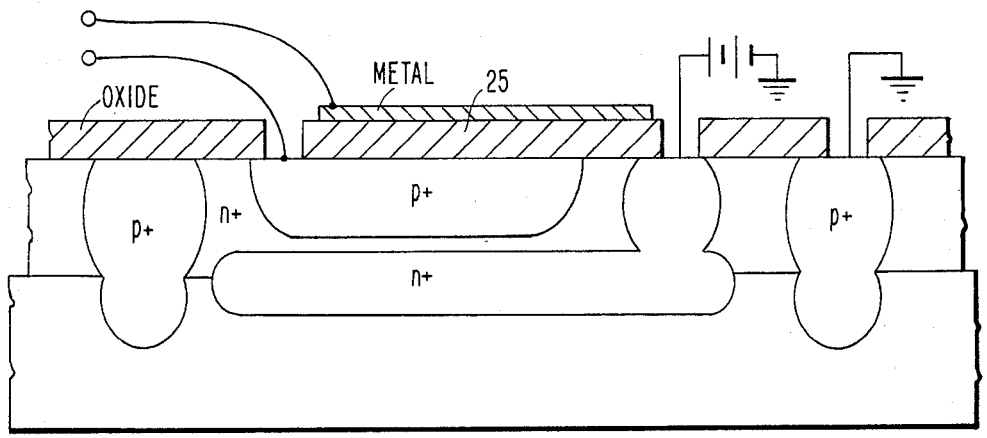
FIG. 6 is a sectional view of an integrated circuit chip illustrating one implementation of a thin film capacitor element which may be employed in the chip of FIG. 5.

FIG. 6 illustrates another implementation of the capacitors C1 and C2 in semiconductor technology. Rather than employing semiconductor junctions, as in FIG. 5, capacitors C1 and C2 are formed in FIG. 6 by means of a thin film metal layer disposed on a layer of insulating material over the semiconductor material. Details of thin film capacitors may be found in a book entitled *Analog Integrated Circuit Design*, published by Van Nostrand Reinhold Company, copyright 1972 by Litton Educational Publishing, Inc., particularly the section entitled "Thin Film Capacitors" beginning on page 78.

While FIGS. 4 and 5 represent a bipolar semiconductor circuit technology implementation, it should be understood that other semiconductor circuit technologies, such as an FET technology, may be employed.

While the invention has been particularly shown and described with reference to a preferred embodiment thereof, it will be understood by those skilled in the art that various changes in the form and details may be made therein without departing from the spirit and scope of the invention.

Having thus described my invention, what I claim as new and desire to secure by Letters Patent is:

1. An adjustable filter having an input terminal and an output terminal and at least one control terminal, said filter comprising first and second resistor elements, first and second capacitor elements, an amplifier element, and means interconnecting said elements between said input and output terminals to define a SALLEN-KEY type filter configuration, said filter being formed on a semiconductor chip as an integrated circuit having a transistor amplifying device as said amplifier element, a first pair of diodes interconnected as said first and second resistor elements, said control terminal being connected between the base of said transistor amplifying device and said diode corresponding to one of said resistor elements whereby the value of the first and second resistor elements may be adjusted in accordance with an external control current supplied to said control terminal to adjust the cutoff frequency of said filter.

2. The filter set forth in claim 1 further including a second control terminal connected between the diodes of said first pair of diodes corresponding to said resistor elements whereby the values of said first and second resistor elements may be adjusted differentially in accordance with the current supplied to said second control terminal.

3. The filter set forth in claim 2 further including means for supplying control currents to said one control terminal and said second control terminal.

4. The filter set forth in claim 3 in which said means for supplying a current includes at least one current output digital to analog converter connected to one of said control terminals and a digital register which has its output connected to the input of said digital to analog converter.

5. The filter set forth in claim 4 in which said one digital to analog converter and said digital register are formed as integrated circuits on said semiconductor chip.

6. The filter set forth in claim 5 further including means for selectively loading said register with with predetermined binary values to adjust the frequency dependent characteristics of said filter.

7. The filter set forth in claim 6 in which said analog to digital converter is connected to said one control terminal to cause the natural frequency of said filter to be adjusted in accordance with the value set in said one register.

8. The filter set forth in claim 1 further including integrated circuit structure on said chip functioning as said first and second capacitive elements of said filter.

9. The filter set forth in claim 8 in which said integrated circuit structure comprises at least one thin film capacitor element disposed on said chip.

10. The filter set forth in claim 8 in which said integrated circuit structure functioning as said first and second capacitive elements corresponds to the depletion capacitance of first and second reverse biased base emitter junctions of NPN transistors integrated into said chip.

* * * * *

UNITED STATES PATENT AND TRADEMARK OFFICE
CERTIFICATE OF CORRECTION

PATENT NO. : 4,513,254
DATED : Apr. 23, 1985
INVENTOR(S) : Jerome D. Harr

It is certified that error appears in the above—identified patent and that said Letters Patent is hereby corrected as shown below:

Column 2, line 41, "tol" should be --to--.

IN THE CLAIMS

Column 6, line 7, claim 1, "an" should be --the--.

Signed and Sealed this

Thirteenth Day of August 1985

[SEAL]

Attest:

DONALD J. QUIGG

Attesting Officer     Acting Commissioner of Patents and Trademarks